(12) United States Patent
Ostholt et al.

(10) Patent No.: US 9,924,601 B2
(45) Date of Patent: Mar. 20, 2018

(54) METHOD FOR THE METALLATION OF A WORKPIECE AND A LAYER STRUCTURE MADE UP OF A WORKPIECE AND A METAL LAYER

(71) Applicant: LPKF Laser & Electronics AG, Garbsen (DE)

(72) Inventors: Roman Ostholt, Isernhagen (DE); Robin Alexander Krueger, Hannover (DE); Bernd Roesener, Porta Westfalica (DE); Eugen Haumann, Seelze (DE)

(73) Assignee: LPKF LASER & ELECTRONICS AG, Garbsen (DE)

( * ) Notice: Subject to any disclaimer, the term of this patent is extended or adjusted under 35 U.S.C. 154(b) by 125 days.

(21) Appl. No.: 14/653,274

(22) PCT Filed: Dec. 3, 2013

(86) PCT No.: PCT/DE2013/100405
§ 371 (c)(1),
(2) Date: Oct. 1, 2015

(87) PCT Pub. No.: WO2014/094729
PCT Pub. Date: Jun. 26, 2014

(65) Prior Publication Data
US 2016/0037650 A1    Feb. 4, 2016

(30) Foreign Application Priority Data

Dec. 18, 2012    (DE) .................. 10 2012 112 550

(51) Int. Cl.
| C23C 18/16 | (2006.01) |
| C23C 18/20 | (2006.01) |
| C23C 18/18 | (2006.01) |
| C23C 18/30 | (2006.01) |
| H05K 3/18  | (2006.01) |

(Continued)

(52) U.S. Cl.
CPC .............. *H05K 3/181* (2013.01); *B44F 3/00* (2013.01); *C23C 18/165* (2013.01);
(Continued)

(58) Field of Classification Search
CPC .............. C23C 18/1608; C23C 18/165; C23C 18/2013; C23C 18/31; C23C 18/1841; C23C 18/208; C23C 18/30
See application file for complete search history.

(56) References Cited

U.S. PATENT DOCUMENTS

| 4,554,183 A | 11/1985 | Sirinyan et al. |
| 6,601,297 B1 | 8/2003 | Schmidt |

(Continued)

FOREIGN PATENT DOCUMENTS

| CN | 101048537 A | 10/2007 |
| DE | 10054544 A1 | 5/2002 |

(Continued)

OTHER PUBLICATIONS

Reif J et al: "Self-organized regular sirface patterning by pulsed laser ablation", Physica Status Solidi ©, Wiley-VCH Verlag, Berlin, DE, vol. 6, No. 3, Jan. 14, 2009 (Jan. 14, 2009), pp. 681-686, XP002583523.

*Primary Examiner* — James Mellot
(74) *Attorney, Agent, or Firm* — Leydig, Voit & Mayer, Ltd.

(57) ABSTRACT

A method for the at least portion-wise and adhesive metallization of a non-conductive workpiece includes introducing periodic microstructures into the workpiece in regions to be metallized, within an area to be metallized that is enclosed by one or more limiting lines, by molding a tool that is microstructured in accordance with the regions to be metallized within a molding area.

14 Claims, 5 Drawing Sheets

(51) Int. Cl.
    *C25D 5/00*       (2006.01)
    *C25D 5/02*       (2006.01)
    *H05K 3/00*       (2006.01)
    *H05K 3/38*       (2006.01)
    *B44F 3/00*       (2006.01)
    *C23C 18/31*     (2006.01)
    *H05K 1/02*       (2006.01)

(52) U.S. Cl.
    CPC ........ *C23C 18/1608* (2013.01); *C23C 18/204* (2013.01); *C23C 18/2013* (2013.01); *C23C 18/31* (2013.01); *C25D 5/00* (2013.01); *C25D 5/02* (2013.01); *H05K 1/0296* (2013.01); *H05K 3/0014* (2013.01); *H05K 3/182* (2013.01); *H05K 3/381* (2013.01); *C23C 18/1841* (2013.01); *C23C 18/208* (2013.01); *C23C 18/30* (2013.01); *H05K 2201/2072* (2013.01); *H05K 2203/0113* (2013.01)

(56) References Cited

U.S. PATENT DOCUMENTS

| | | | |
|---|---|---|---|
| 2003/0059632 A1* | 3/2003 | Inoue | C23C 30/005 428/457 |
| 2003/0135998 A1 | 7/2003 | Walz et al. | |
| 2004/0086646 A1 | 5/2004 | Brandes et al. | |
| 2006/0040058 A1* | 2/2006 | Heidari | B29C 33/60 427/256 |
| 2007/0099425 A1 | 5/2007 | Schildmann et al. | |
| 2008/0217180 A1 | 9/2008 | Dove et al. | |
| 2009/0212292 A1* | 8/2009 | Hayton | H01L 51/0023 257/66 |
| 2011/0240350 A1* | 10/2011 | Meinder | B82Y 10/00 174/258 |
| 2012/0237731 A1 | 9/2012 | Boegli et al. | |
| 2013/0189485 A1* | 7/2013 | Gupta | B29C 59/02 428/141 |

FOREIGN PATENT DOCUMENTS

| | | |
|---|---|---|
| DE | 102005051632 B4 | 5/2007 |
| DE | 102010034085 A1 | 2/2012 |
| EP | 0146724 B1 | 7/1985 |
| EP | 2124514 A1 | 11/2009 |
| EP | 2367405 A1 | 9/2011 |
| JP | S 60218495 A | 11/1985 |
| JP | H 10308562 A | 11/1998 |
| JP | 2006168260 A | 6/2006 |
| JP | 201080946 A | 4/2010 |
| WO | WO 0013062 A1 | 3/2000 |
| WO | WO 0150825 A1 | 7/2001 |
| WO | WO 2008048840 A2 | 4/2008 |

* cited by examiner

30 μm

2 μm

METHOD FOR THE METALLATION OF A WORKPIECE AND A LAYER STRUCTURE MADE UP OF A WORKPIECE AND A METAL LAYER

CROSS-REFERENCE TO PRIOR APPLICATIONS

This application is a continuation of International Patent Application No. PCT/DE2013/100405, filed on Dec. 3, 2013, which claims priority to German Patent Application No. DE 10 2012 112 550.3, filed on Dec. 18, 2012. The International Application was published in German on Aug. 14, 2014 as WO 2014/094729 under PCT Article 21(2). The entire disclosure of both applications is hereby incorporated by reference herein.

FIELD

The invention relates to a method for the at least portionwise and adhesive metallisation of a non-conductive workpiece. The invention also relates to a layer structure comprising a workpiece and an adhesive metal layer connected thereto by means of a structuring.

BACKGROUND

Since injection-moulded plastics material parts made of ABS (acrylonitrile butadiene styrene) were successfully adhesively wet-chemically metallised for the first time at the beginning of the 1960s, there has been a wealth of method developments for also adhesively metallising further industrial plastics materials, for example polyamides (PA), polybutylene terephthalate (PBT) or polycarbonate (PC) with continued-use temperatures of up to about 150° C. and thermally still more highly loadable high-performance plastics materials, for example polyetherimide (PI), polyphenylene sulfide (PPS), polyether ether ketone (PEEK) or liquid crystal polymer (LCP), for the purpose of functional and/or decorative surface finishing.

To generalise, the pretreatment of plastics material surfaces before their metallisation can be divided into the process steps of conditioning, seeding and activation.

The method step of conditioning, in particular, is of decisive importance for an adhesive metallisation. In the specialist literature an entire series of different chemical and physical methods is described for the surface pretreatment of plastics material surfaces. In particular, the chemical methods are often matched to the nature of the plastics material surface. Essential to all these methods is the opening up of the plastics material substrate surface in order to generate the required adhesive base for the metal layer to be deposited. In the chemical methods, the formation of caverns that are open to the surface and which ensure what is known as the "push-button effect" due to the undercuts and therefore lead to an adhesive metallisation is achieved by pickling or swelling and dissolving out certain components of the plastics material.

Thus, DE 100 54 544 A1 discloses a method for the chemical metallisation of surfaces, in particular of surfaces made of acrylonitrile butadiene styrene copolymers (ABS) and their blends with other polymers, in that the surfaces thereof are pickled in highly concentrated solutions of Cr(VI) ions in sulfuric acid.

It is part of the general understanding of a person skilled in the art that the aggressive pickling attack of these solutions superficially oxidatively degrades the butadiene component from the ABS substrate matrix and dissolves out the oxidation products selectively from the surface and thus allows a porous substrate surface having caverns to develop, which ensures good adhesive strength as a result of the "push-button effect" for the subsequent precious metal seeding and chemical metallisation. In addition, the pickling of the ABS surface leads to a chemical functionalisation with OH and COOH groups. The size, position and relative arrangement of the cavities with respect to one another are therefore not freely selectable, but fixed by the specific composition of the acrylonitrile butadiene styrene (ABS) used.

For the pretreatment of the surface of moulded parts made of polyamide before the currentless metallisation, EP 0 146 724 B1 discloses the treatment in a mixture of halides of the elements of the group IA or IIA of the periodic table with sulfates, nitrates or chlorides of groups IIIA, IIIB, IVA, IVB, VIA and VIIA or of non-precious metals of group VIIIA of the periodic table in a non-etching, organic swelling agent or solvent and a metal-organic complex compound of elements of the group IB or VIIIA of the periodic table.

DE 10 2005 051632 B4 also addresses the problem of pre-treating plastics materials, and especially polyamides, before chemical metallisation, using a method in which plastics material surfaces are treated with a solution containing a halide and/or a nitrate of Na, Mg, Al, Si, Sc, Ti, V, Cr, Mn, Fe, Co, Ni, Cu, Ca or a pickling solution containing Zn ions, said solution containing a soluble fluoride in the form of a coordination compound of the general formula M1(HF2).

With a seeding, activation and subsequent external currentless metallisation of the surface without the above-described conditioning of the plastics material surface, although a metal layer also forms, because of the low adhesion to the substrate, this metal layer is unusable for technical or decorative purposes. In addition, chromosulfuric acid is a highly toxic, carcinogenic material that is harmful to fertility. The safe handling of all surfaces to be metallised with chromosulfuric acid is therefore linked with substantial economic and ecological costs.

It is known from the prior art that by irradiating preferably metals with very short, intensive laser radiation, as available, for example, by means of modern ultrashort pulse lasers, self-organising periodic structures can be produced on the surface. In the literature, three types of laser-induced and self-organising structures are known: "cone like structures" or "spikes" (FIG. 9), "laser induced periodic surface structures" (FIG. 10) and nanospheres, not identified in more detail, which are produced when the surface is irradiated by means of circular polarised laser radiation (FIG. 11). The microstructures mentioned are produced during the laser irradiation of metals at a high intensity and short pulse length (<100 ns) as a result of the photon-phonon interaction in a self-organising process. The precise surface topography cannot be predicted, or not with an acceptable level of effort, before the laser irradiation according to the current level of knowledge. In particular, the precise position of an elevation or a valley cannot currently be predicted, or not with reasonable effort.

Nevertheless, the microstructures have the above-described structural features. These structural features allow a person skilled in the art to sensibly make use of a description of the periodic self-organising structures by means of an—optionally mean—wavelength and amplitude.

Apart from the periodic repetition of specific surface topographies, all the microstructures mentioned share the property that the mean wavelength of the microstructures is usually smaller by a multiple than the usually used dimensions of the interaction zone between the laser radiation and metal surface, so it is clear to a person skilled in the art that the forming of the microstructures cannot be influenced by the selection of the beam diameter, but can obviously be limited to the irradiated region. The forming of the microstructures is instead determined by the present fluence.

The described self-organising laser-induced microstructures are already used in a series of applications. Thus CLPs can be used to increase the absorption of electromagnetic radiation. It is furthermore known that the corresponding negative of the self-organised laser-induced microstructures can be transferred to a plastics material surface by moulding in order, for example, to couple light from an optical fibre or to be used as a safety feature.

Thus DE 10 2010 034 085 A1 describes a method for producing embossing tools, which consist of a substrate, into the surface of which embossing structures for microstructural elements, such as holograms, nanostructures or the like are introduced. The embossing structures for the microstructural elements are introduced into the surface of the substrate by means of ultrashort laser pulses of polarised electromagnetic waves or polarised electromagnetic radiation. A method of surface structuring is thus used to produce embossing tools for microstructural elements. Thus the original structure can be transferred directly to the surface of an embossing tool and film copies can be made thereof.

US 2003/0135998 A1, on the other hand, discloses a method for producing an electric connecting element, characterised by the following method steps: a) providing a substrate of a plastically deformable polymeric material; b) mechanical forming of the substrate by an embossing tool, so substantially channel-shaped indentations are produced where conductor paths are to be produced; c) coating the substrate with an electrically conductive layer; d) galvanising the substrate until the indentations are filled; and e) removing conductor material until those points of the substrate that are not to have a conductive surface are free of a metal coating. The channel-shaped indentation describes the outer geometry of the later conductor path.

SUMMARY

A method for the at least portion-wise and adhesive metallisation of a non-conductive workpiece includes introducing periodic microstructures into the workpiece in regions to be metallised, within an area to be metallised that is enclosed by one or more limiting lines, by moulding a tool that is microstructured in accordance with the regions to be metallised within a moulding area.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
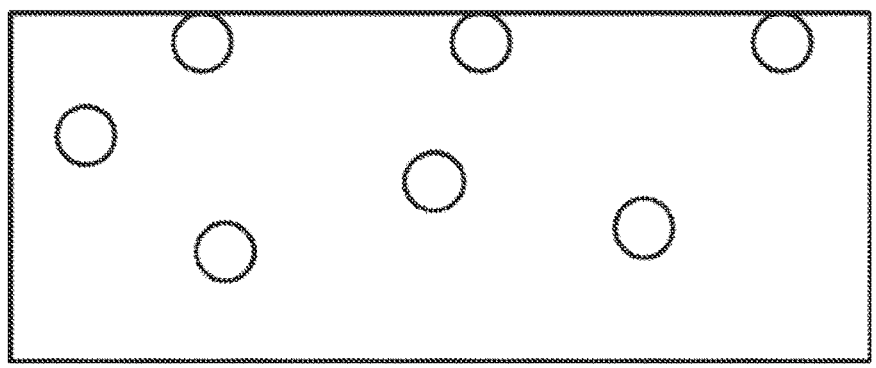
FIG. 1 shows an example of the introduction of structures into a substrate according to the prior art.

In an embodiment, the invention provides an adhesive metallisation that can also be achieved on non-conductive workpieces by microstructures, which are introduced on the workpiece surface and are free of undercuts, in other words which manage without what is known as the "push-button effect". These undercut-free periodic microstructures can preferably be produced by moulding.

According to an embodiment, a method is provided for the at least portion-wise, adhesive metallisation of non-conductive workpieces, in which microstructures are introduced into the workpiece in the regions to be metallised by moulding a microstructured tool, said microstructures preferably being free of undercuts and nevertheless leading to an increase in the adhesive strength. In this case, the microstructures required for adhesive metallisation are produced by a moulding of microstructures of a tool. It is important to the understanding of the invention that the periodic microstructures relate to the area to be metallised later. Accordingly these are microstructured regions of the type enclosed by limiting lines of the metallisation. Thus, the term "microstructures" does not define the absolute size of the metallised area, but the properties within the metallised area.

The moulding can take place by a microstructuring both of a primary-shaping and a forming tool. It is obvious to a person skilled in the art that by a moulding of this type of the microstructures, only structures can be produced which, according to the present invention, substantially have no undercuts.

The microstructure is preferably produced in the tools by means of laser radiation. Self-organising laser-induced microstructures have proved to be particularly favourable microstructures in the tool. Such structures are known to a person skilled in the art under the designations "cone like protrusions" (CLP), "spikes", "nanoripples" or "nanospheres".

CLPs are preferred according to the invention if a particularly great adhesive strength is required; nanoripples or nanospheres are preferred when decorative, in other words particularly smooth metal surfaces, are aimed for.

The geometry of the CLPs is generally direction-independent, so the wavelength of the structure is approximately constant in any two spatial directions arranged orthogonally to one another. CLPs generally have a mean wavelength of about 5-30 µm and a structural height <100 µm, in particular <50 µm.

Nanoripples have an orientation that depends on the polarisation direction of the laser radiation, so they are only meaningfully described by a wavelength in one spatial direction. The mean wavelength of nanoripples is <5 µm, typically <1 µm. The amplitude of the nanoripples is generally <5 µm, typically <2 µm.

The nanospheres are in turn produced with an irradiation with circular polarised laser radiation and have a virtually spherical surface portion with a diameter <1 µm.

The microstructures (6) of the workpiece preferably have a monotonically increasing, in particular a strictly monotonically increasing, cross section in the direction of the workpiece.

The microstructures (6) preferably have a mean structural height (peak-to-valley) of less than 50 µm. The ratio of the mean structural height (peak-to-valley) of the microstructures (6) to the mean wavelength of the microstructures (6) is preferably more than 0.3, in particular more than 0.5, preferably more than 1.

The microstructured tool preferably has, according to the invention, at least in a part region of the surface provided for moulding the workpiece, a microstructured region, i.e. a region having elevations or indentations as microstructures. In a preferred embodiment, the entire surface of the microstructured tool provided for moulding the workpiece has a microstructured region of this type. In another preferred embodiment, this microstructured region makes up only at most 90%, preferably at most 80%, of that surface of the microstructured tool provided for moulding the workpiece.

By moulding the workpiece by means of this microstructured tool, a workpiece is then produced, the surface of which also has a microstructured (part) region, but as a negative contour, i.e. microstructural elevations in the tool surface are moulded as microstructural indentations in the workpiece surface and vice versa.

The preferred embodiments described below are defined in such a way that the tool surface has indentations and elevations are correspondingly moulded in the workpiece surface. As the perception of a microstructure as an indentation or elevation is ultimately arbitrary, a person skilled in the art recognises that these preferred embodiments also apply analogously to the reverse case, in which the tool surface has elevations that are moulded as indentations in the workpiece surface.

The microstructured (part) region of the tool surface or the microstructured (part) region of the moulded workpiece surface preferably has a main extension face, with respect to which indentations or elevations are arranged orthogonally.

In a preferred embodiment, this main extension face is substantially a planar plane. In another preferred embodiment, this main extension face is curved, for example convex or concave.

The microstructures preferably bring about an increase in the surface area of the microstructured (part) region of the tool surface or workpiece surface in comparison to the non-microstructured, i.e. substantially smooth, surface. This increase in the surface area is preferably at least 40% or at least 50%, more preferably at least 60% or at least 70%, still more preferably at least 80%, or at least 100%, most preferably at least 150% or at least 200%, and in particular at least 250% or at least 300%. Methods for determining the surface area are known to a person skilled in the art, for example by measuring the BET adsorption isotherm to DIN ISO 9277:2003-05.

Using the method according to the invention, any non-conductive materials can be processed. Materials, the main component of which is a polymer or a polymer mixture are particularly relevant to the metallisation by the present method. It is obvious to a person skilled in the art here that the method according to the invention is not restricted to specific plastics materials. Rather, in contrast to the metallisation methods from the prior art, both thermoplastic and thermosetting materials, which may be etchable or non-etchable, can be processed using the method.

In a preferred embodiment, the workpiece surface, into which the microstructures according to the invention are introduced, comprises a thermoplastic. The thermoplastic is preferably selected from the group consisting of polyamide, polyester (for example polylactate, polyethylene terephthalate, polybutylene terephthalate), polyurethane, polycarbonate, polyacrylonitrile, polymethyl methacrylate, polyolefin (for example polyethylene, polypropylene, polymethylpentene, polybutene), polystyrene, acrylonitrile butadiene styrene, polyvinyl chloride, polyetherimide, polyphenylene sulfide, polyether ether ketone, liquid crystal polymer and copolymers thereof and/or mixtures thereof.

If the workpiece surface according to the invention, into which the microstructures according to the invention are introduced, comprises acrylonitrile butadiene styrene (ABS), the butadiene component is preferably still completely present as the microstructures are not produced according to the invention by etching the workpiece surface.

In another preferred embodiment, the workpiece surface, into which the microstructures according to the invention are introduced, comprises a thermosetting plastic. The thermosetting plastic is preferably selected from the group consisting of aminoplasts, phenoplasts, polyurethanes, epoxy resins and cross-linked polyacrylates.

Likewise, the method according to the invention allows the at least selective metallisation of a non-conductive workpiece with locally different adhesive strengths, so predetermined breaking points, etc., can be configured in this manner.

The metal layer preferably has an adhesive strength to ASTM D1876-08 of at least 3 N/cm, more preferably at least 5 N/cm, still more preferably at least 8 N/cm and in particular at least 11 N/cm.

In this case, it is particularly promising if the microstructure is repeatedly reproduced on the workpiece surface of the same workpiece by means of the tool. By repeated use of the tool, a multiple reproduction of the microstructures is thus achieved, which can be supplemented to form a total metal structure during the later metallisation. The outlay for producing the tool is reduced in that only a single tool has to be produced for coincidental microstructures. Moreover, a plurality of identical or different tools can be modularly combined to form a combination tool in order to thus allow flexible use and the possibility for reuse in other application purposes.

For the galvanic or external currentless metallisation in a manner known per se, the workpiece surface should be enriched, at least in the regions of later adhesive metallisation, either with catalytically acting seeds or with a thin conductive starting layer. A thin conductive layer could, for example, be produced by a vaporisation of metals or by "chemical vapour deposition" (CVD). Much more promising is the seeding of the surface with, for example, palladium or silver, as known in the prior art, and a subsequent galvanic metallisation, as also known from the prior art.

It has proved surprising to a person skilled in the art here that a not only adhesive, but also amazingly simple, selective metallisation can be achieved with high resolution and without extraneous deposits on undesired regions.

By means of a simple washing step after the seeding, the enrichment of the catalytically acting seeds can be restricted to the regions of the microstructures, while they are efficiently and obviously very effectively removed in non-microstructured regions. The selective metallisation by the method according to the invention could be used to produce MIDs (moulded interconnect devices) or decorative metallic patterns. The adhesive metal layer is preferably applied in distinct patterns, in particular conductor paths or decorative patterns, to the workpiece surface.

The workpiece is preferably thermally treated in the course of the method according to the invention.

The further object of providing a corresponding layer structure of a workpiece and a metal layer is achieved according to the invention in that the structuring is substantially formed by microstructures, which are introduced free of undercuts in the workpiece. In this case, the object of the invention is the knowledge, which is surprising to a person skilled in the art, that an adhesive metallisation is possible on non-conductive workpieces, in which the workpiece in the metallised regions has microstructures that are substantially free of undercuts. Using the method according to the invention, any non-conductive materials can be processed.

Particularly relevant to the metallisation by the present method are materials, the main component of which is a polymer, the layer structure not being limited to specific plastics materials, but it also being possible for said layer structure to comprise thermoplastic components as well as thermosetting components.

Embodiment 1

In a first embodiment, an injection-moulding tool made of the tool steel 1.2343 is structured by means of picosecond laser radiation selectively with CLPs (laser power 12 W, wavelength 515 nm, scan speed 50 mm/s, beam diameter in the interaction zone 30 μm). Using the structured tool, samples of polyamide (PA) are injection moulded. The injection-moulded samples are then immersed for one minute in a 50° C. silver nitrate solution (10 g silver nitrate dissolved in 800 ml water). After a washing step with deionised water and drying of the sample, the sample is post-treated for 20 minutes in a furnace at 120° C. The sample is then metallised in an external currentless metallisation bath. In this case, a very selective metallisation of the microstructured regions without extraneous deposits is shown. To measure the adhesive strength, the sample is galvanically subsequently reinforced to a thickness of about 25 μm. An adhesive strength to ASTM D1876-08 of greater than 10 N/cm is measured on the sample thus produced.

Embodiment 2

In the second example, an embossing die is selectively structured with CLP using the method mentioned in the first example and moulded on a sample of PC+ABS blend. The sample is then vaporised with gold. Because of the continuous conductive starting layer, this sample is directly galvanically metallised. An adhesive strength to ASTM D1876-08 of greater than 15 N/cm is measured on the sample thus produced.

Embodiment 3

A workpiece made of polybutylene terephthalate (PBT) and structured by the above method is etched for ten minutes at 60° C. in an alkaline solution of 45 g sodium hydroxide and 45 g potassium permanganate in one liter of water in order to chemically functionalise the surface and thus prepare it for a loading with palladium ions. The workpiece is then washed with deionised water and incubated for 10 minutes in a solution of 200 mg palladium chloride in 20 ml water. Thereupon, the surface is directly wetted with a solution of 1 g sodium salt of 9,10-anthrachinone-2,6-disulfonic acid in 10 ml glycol and irradiated for 10 minutes with a conventional commercial laboratory UV lamp. After washing with water, copper is deposited at the points thus treated in a chemical metallisation. An adhesive strength to ASTM D1876-0B of greater than 12 N/cm is measured on the sample thus produced.

Figure 2:
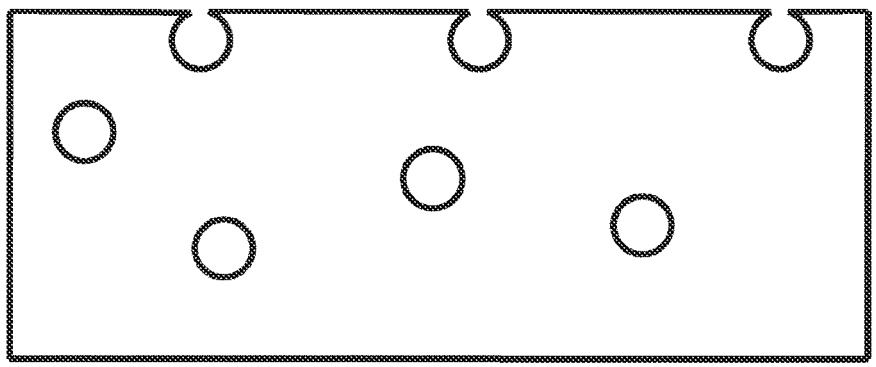
FIG. 2 shows the introduction of cavities into the substrate by means of an etching method according to the prior art.
Figure 3:
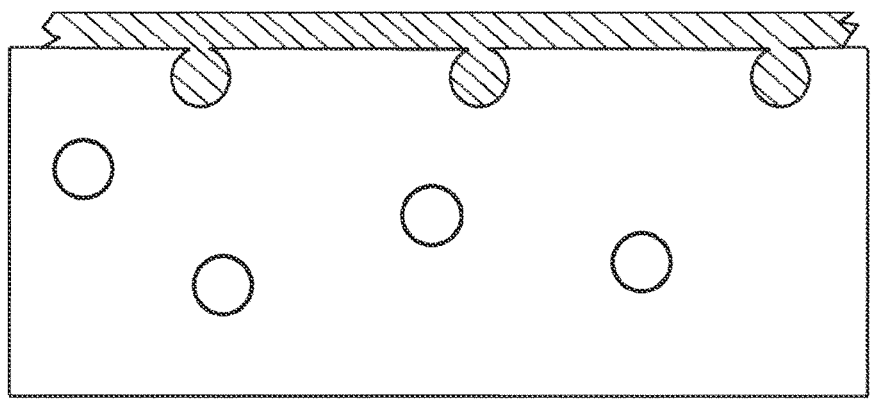
FIG. 3 shows a metal layer connected to the substrate by undercuts in the cavities in the prior art.

For easier understanding, the method sequence when introducing microstructures into a substrate by means of an etching method according to the prior art is shown in FIGS. 1 to 3. As can be seen, specific components contained in the workpiece (shown laterally in cross section) are opened up by means of the etching method by removing the workpiece surface and then chemically dissolved out of the workpiece. As a result, the cavities desired in the prior art are produced, and are extended proceeding from the workpiece surface into deeper layers, as can be seen in FIG. 2. These are therefore optimally suited for configuring undercuts for the metal layer shown in FIG. 3, which is adhesively connected thereby to the workpiece.

Figure 4:
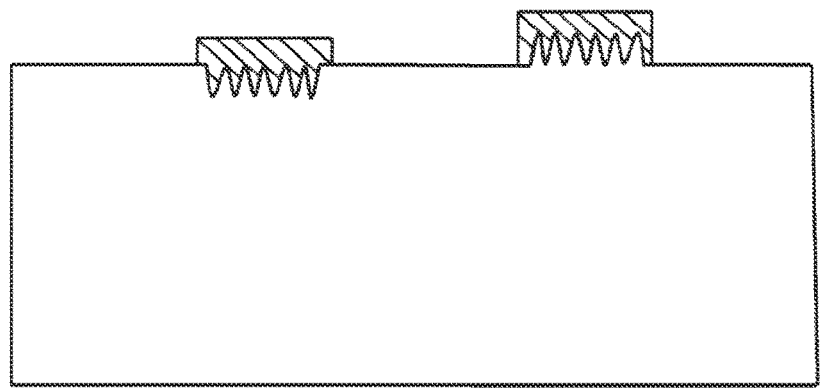
FIG. 4 shows conical microstructures according to the invention without undercuts.
Figure 5:
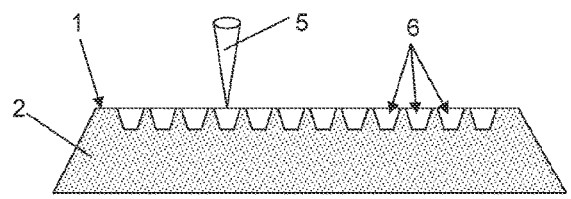
FIG. 5 shows the introduction according to the invention of microstructures (indentations) into a tool surface of an embossing tool.
Figure 6:
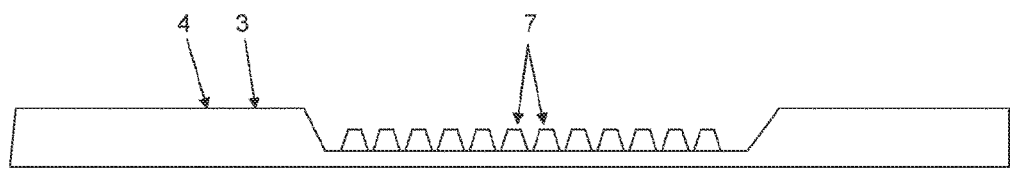
FIG. 6 shows a negative contour to the microstructure shown in FIG. 5, said negative contour being introduced according to the invention by means of the embossing tool into a workpiece surface.
Figure 7:
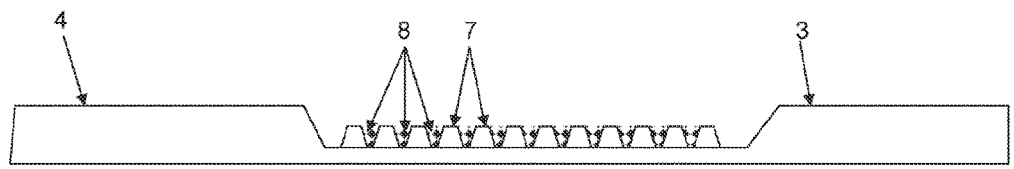
FIG. 7 shows the workpiece surface according to the invention provided with metal seeds.
Figure 8:
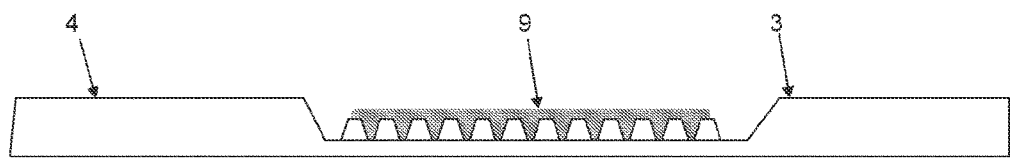
FIG. 8 shows a workpiece surface according to the invention provided with a metal layer.

In comparison, FIG. 4 shows in a schematic view the different form of the microstructures produced according to the invention as well as the metal layer applied thereon. As can be seen, the microstructures have a shape tapering in the direction of the metal layer, as can be realised, for example, by cone or pyramid shapes. In this case, the invention is obviously not limited to regular structures. As can be seen in the left-hand part of FIG. 4, the microstructures can be introduced as a negative contour in such a way that the workpiece surface is only removed in the region of the microstructures to be produced. In the right-hand part of the figure, the microstructures project relative to the workpiece surface surrounding them. For this purpose, the workpiece surface recessed from the microstructures is removed over a large area.

The method according to the invention for surface processing of a tool surface 1 of a tool 2 and the processing of a workpiece surface 3 on a workpiece 4 by means of the tool 2 will be described in more detail below with the aid of FIGS. 5 to 8. In this case, microstructures 6 are introduced as substantially regular elevations and indentations in a first method step by means of a laser beam 5 into the tool surface 1. In this case, the laser beam 5 removes material from the tool surface 1, whereby indentations are produced. Those regions of the tool surface 1, at which the laser beam 5 does not remove any material or less material, remain as elevations relative to the indentations. These elevations and indentations are transferred in a following method step to the workpiece surface 3, in that by means of the tool 2 configured as an embossing tool, the workpiece surface 3 is partially formed and the microstructures 6 are reproduced as a negative contour 7 on the workpiece surface 3 within an area that is subsequently to be metallised and is enclosed by limiting lines. A seeding of the negative contour 7 then takes place with metal seeds 8, in particular palladium seeds, which adhere only in the region of the negative contour 7 and can be removed without problems in the remaining regions. In this case, the metal seeds 8 penetrate into the workpiece surface 3, so proceeding from the metal seeds 8, by a subsequent metallisation, a flat or linear metal layer 9 is produced. In this manner, a rapidly and easily reproducible possibility is achieved for producing the negative contour 7 corresponding to the microstructures 6 in the workpiece surface 3, in which a direct action of the laser on the workpiece surface 3 can be dispensed with and therefore workpiece materials of the type that are unsuitable for laser processing can also be used. Rather, the transfer of the microstructures 6 to the workpiece surface 3 assumes only their mouldability, so the method according to the invention can be successfully used in a large number of materials and types of materials. In addition, a clear reproducibility is ensured, so processing faults are largely ruled out.

Figure 9:
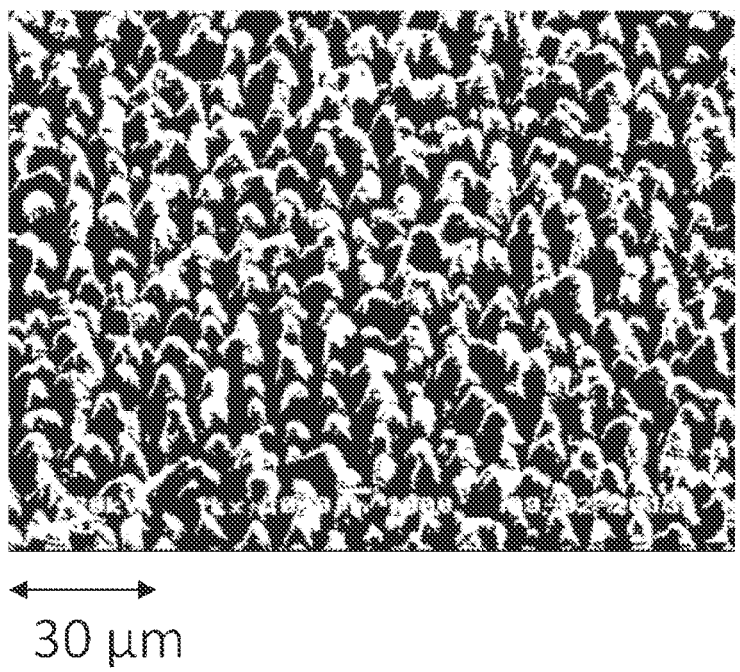
FIG. 9 shows an SEM image of a workpiece surface according to the invention, on which cone like protrusions are visible as microstructures.
Figure 10:
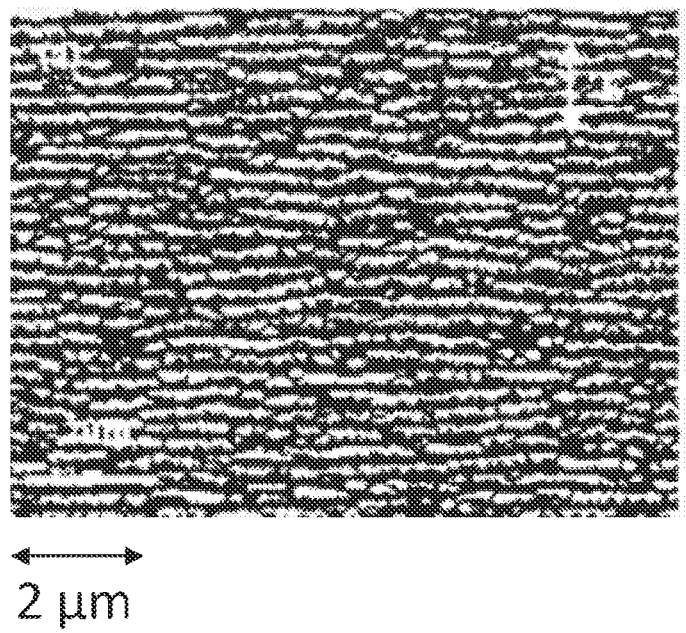
FIG. 10 shows an SEM image of a tool surface according to the invention, on which nanoripples are visible as microstructures.
Figure 11:
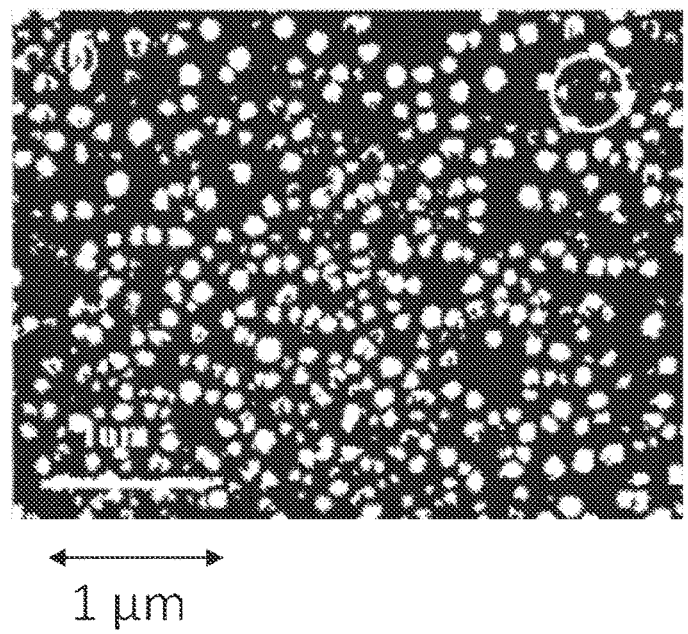
FIG. 11 shows an SEM image of a tool surface according to the invention, on which nanospheres are visible as microstructures.

FIGS. 9 to 11 show various forms of the microstructures on the workpiece with the aid of SEM images of the tool surface. Therein, FIG. 9 shows cone like protrusions, FIG. 10 shows nanoripples and FIG. 11 shows nanospheres as microstructures according to the invention on the tool surface.

Figure 12:
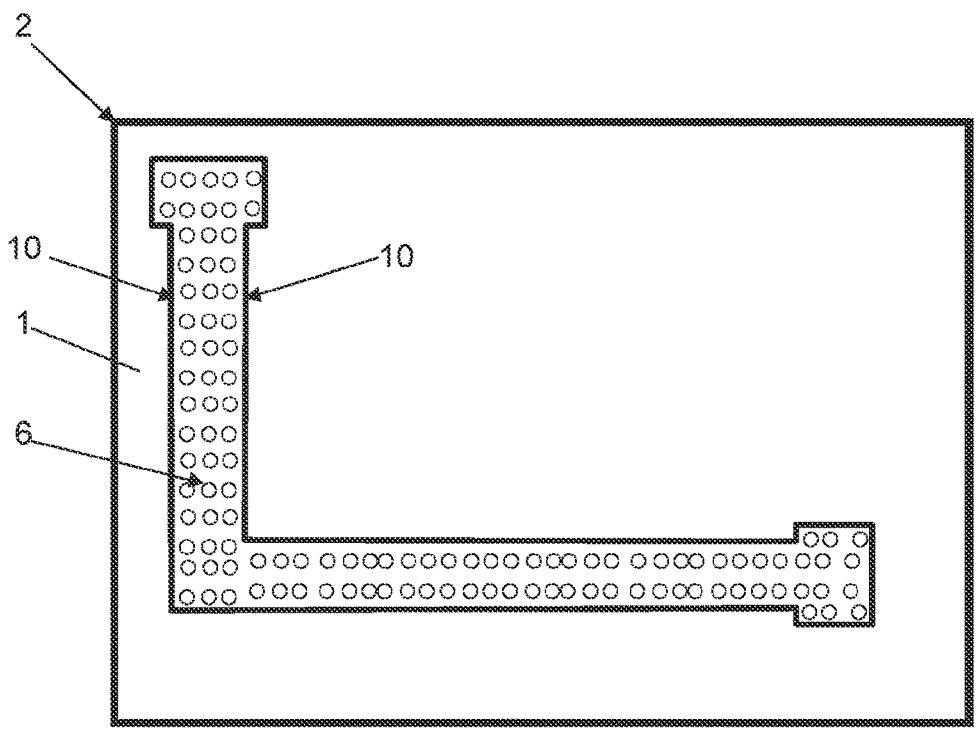
FIG. 12 shows a workpiece provided with microstructures.

FIG. 12 by way of example shows the workpiece 2 configured as a circuit board in a plan view, a surface processing of the tool surface 1 having taken place in the region of the conductor paths to be produced. The microstructures 6 can thus be seen as substantially regular elevations and indentations within an area to be subsequently metallised and enclosed by limiting lines 10, which microstructures have been introduced by moulding the microstructured tool 2 shown in FIG. 5.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A method for the at least portion-wise and adhesive metallisation of a non-conductive workpiece, the method comprising:
    producing periodic self-organizing microstructures having a conical shape in a surface of a moulding tool by laser radiation with a pulse length of less than one nanosecond;
    introducing the microstructures into the workpiece in regions to be metallised, within an area to be metallised that is enclosed by one or more limiting lines, by the moulding tool that is microstructured in accordance with the regions to be metallised within a moulding area such that the microstructures form a negative contour in a surface of the work piece;
    seeding a region of the negative contour with metal seeds which adhere only in the region of the negative contour; and
    performing a metallisation, proceeding from the seeds, so as to form a metal layer in the regions to be metallised that covers the microstructures of the negative contour.

2. The method of claim 1, wherein the moulding tool comprises a primary shaping metallic tool.

3. The method of claim 1, wherein the moulding tool comprises a forming metallic tool.

4. The method of claim 1, wherein the metal layer produced by the metallisation has an adhesive strength according to ASTM D1876-08 of at least 3 N/cm.

5. The method of claim 1, wherein a component of the non-conductive workpiece is a polymer.

6. The method of claim 1, wherein a surface of the workpiece is provided in part with microstructures having a different form.

7. The method of claim 1, wherein the workpiece is thermally treated in the course of the method.

8. The method of claim 1, wherein the microstructures are repeatedly reproduced by the tool on a workpiece surface of the same workpiece.

9. The method of claim 1, wherein the adhesive metal layer is applied to a surface of the workpiece in conductor paths or decorative patterns.

10. The method of claim 1, wherein the microstructures have a mean wavelength of greater than 1 μm and less than 200 μm.

11. The method of claim 1, wherein the microstructures have a mean structural height (peak-to-valley) of greater than 5 μm and less than 200 μm.

12. The method of claim 1, wherein the ratio of a mean structural height (peak-to-valley) of the microstructures to a mean wavelength of the microstructures is greater than 0.3.

13. The method of claim 1, wherein the microstructures of the workpiece in the direction of the workpiece have a monotonically increasing cross section.

14. The method of claim 1, further comprising washing the seeds from non-microstructured regions of the workpiece.

* * * * *